(12) United States Patent
Watanabe et al.

(10) Patent No.: US 6,614,113 B2
(45) Date of Patent: *Sep. 2, 2003

(54) SEMICONDUCTOR DEVICE AND METHOD FOR PRODUCING THE SAME

(75) Inventors: Eiji Watanabe, Kawasaki (JP); Kouichi Murata, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/515,515

(22) Filed: Feb. 29, 2000

(65) Prior Publication Data

US 2002/0003302 A1 Jan. 10, 2002

(30) Foreign Application Priority Data

Apr. 13, 1999 (JP) .............................. 11-105586

(51) Int. Cl.⁷ .......................... H01L 23/48; H01L 23/52; H01L 29/40
(52) U.S. Cl. ...................... 257/750; 257/751; 257/737; 257/738; 257/780; 257/786; 257/773; 438/614
(58) Field of Search ................................ 257/737, 738, 257/778–780, 786, 750

(56) References Cited

U.S. PATENT DOCUMENTS

| | | | | |
|---|---|---|---|---|
| 4,970,571 A | * | 11/1990 | Yamakawa et al. | 357/71 |
| 5,631,499 A | * | 5/1997 | Hosomi et al. | 257/737 |
| 5,648,686 A | * | 7/1997 | Hirano et al. | 257/778 |
| 5,977,632 A | * | 11/1999 | Beddingfield | 257/737 |

FOREIGN PATENT DOCUMENTS

JP  07-297149  11/1995

OTHER PUBLICATIONS

English translation of the Office Action; Ref. No.: Chichuan No. 09083006698; Apr. 19, 2001.

* cited by examiner

*Primary Examiner*—Steven Loke
*Assistant Examiner*—Nitin Parekh
(74) *Attorney, Agent, or Firm*—Armstrong, Westerman & Hattori, LLP

(57) ABSTRACT

A semiconductor device includes a barrier metal structure which are sandwiched between an electrode provided on a semiconductor chip and a bump. The barrier metal structure has a first through third conductive metal layers, where the third conductive metal layer as an uppermost layer thereof in contact with the bump covers the second conductive metal layer made of a material which is weak in resistance to diffusion and oxidation.

4 Claims, 5 Drawing Sheets

SEMICONDUCTOR DEVICE AND METHOD FOR PRODUCING THE SAME

BACKGROUND OF THE INVENTION

1. Field of the Invention

The present invention generally relates to semiconductor devices and methods for producing the same, and more particularly to a semiconductor device and a method for producing the semiconductor device, in which electrodes provided on a semiconductor substrate are respectively connected to protruding electrodes via barrier metal structure.

In recent years, with increasing demand for miniaturized semiconductor devices, a flip-chip type semiconductor device, which uses protruding electrodes such as bumps severing as connecting terminals, has attracted considerable attention.

The semiconductor device, on the other hand, is requested to have high reliability, and for this reason it is necessary to produce the protruding electrodes with the high reliability.

2. Description of the Related Art

FIG. 1 shows a conventional semiconductor device 1 with common protruding electrodes. As shown in this diagram, the semiconductor device 1 includes a plurality of electrode pads 3 on a circuit-forming surface of a semiconductor chip 2 thereof, and a plurality of bumps 4 are respectively provided on these electrode pads 3.

FIG. 2 is an enlarged diagram showing the electrode pad 3 and other parts therearound of the semiconductor device 1. As shown in this diagram, the bump 4 is not mounted directly on the electrode 3 but is connected thereto via a barrier metal structure 10 which is provided thereon. A detailed description of FIG. 2 is now given as follows.

The circuit-forming surface is protected by an insulating layer 6 formed thereon. The insulating layer 6 includes an aperture 7 designed in a position where the electrode 5 is formed, wherein the aperture 7 exposes the part of the circuit-forming surface on which the electrode 5 is to be formed.

The barrier metal structure 10 is configured to be a deposited structure consisting of three deposited layers: a first conductive metal layer 11, a second conductive metal layer 12 and a third conductive metal layer 13. Such a barrier metal structure 10 severs to prevent the metal element constituting solder bump 4 from causing a diffusion into the electrode pad 3. Specifically, since the bump 4 is an alloy of various metal elements, when the solder bump 4 is directly soldered to the electrode 5, the metal elements therein may penetrate into the electrode 5 by way of diffusion. This brings about a problem that the durability of the electrode pad 3 declines and thereby the brittle bump 4 may be detached from the electrode pad 3. Accordingly, the barrier metal structure 10 is provided just for eliminating the problem.

The first conductive metal layer 11, an undermost layer of the barrier metal structure 10, may be made of a material having a good adherence property with the electrode pad 3. The second conductive metal layer 12, deposited on the first conductive metal layer 11, may be made of a material having a good adherence with the first conductive metal layer 11. The third conductive metal layer 13, deposited on the second conductive metal layer 12, may be made of a material having not only a property of adhering to the second conductive metal layer 12 and to the bump 4 but also a property of preventing the diffusion of the metal elements in the bump 4.

The barrier metal structure 10 is formed in the following manner. First, the first conductive metal layer 11 is formed on the semiconductor chip 2 so as to cover the electrode pad 3. Second, the second conductive metal layer 12 is deposited on the first conductive metal layer 11 and then a resist having an opening corresponding to a predetermined shape of the barrier metal structure 10 is formed thereon. Third, in a state of the presence of the resist, the third conductive metal layer 13 is deposited on the second conductive metal layer 12. Finally, by removing the resist and unwanted parts of the first and second conductive metal layers 11 and 12, the barrier metal structure 10 is formed.

Meanwhile, the material used for forming the second conductive metal layer 12 is required to have a good adherence with respect to both of the first and third conductive metal layers 11 and 13. For this reason, the degree of freedom in selecting the material for the second conductive metal layer 12 is limited. Conventionally, in order to mainly meet the priority of requirement of adherence, a material inferior in terms of resistance to diffusion and oxidation, has to be used for the second conductive metal layer 12.

Further, it should be noted that the conventional barrier metal structure 10 is configured such that the second conductive metal layer 12 exposes its side wall surface. This brings about the problem that, during the forming of the bump 4, the material forming the bump 4 may have contacted with the exposed side wall surface of the second conductive metal layer 12.

In such a conventional structure, the metal elements constituting the bump 4, tend to penetrate into the second conductive metal layer 12 in a lateral direction from the side surface thereof. This brings about a degradation in the barrier properties of the second conductive metal layer 12, and the second conductive metal layer 12 tends to become brittle of as a result of the lateral diffusion. In the worst case, the first and third conductive metal layers 11 and 13 may separate from each other at the second conductive metal layer.

Further, in the case where the second conductive metal layer 12 is formed of a material weak in the oxidation resistance, the exposed side wall surface thereof easily oxidized. When the side wall surface of the second conductive metal layer 12 is thus oxidized, the exposed wall surface is not covered by the molten solder alloy at the time of transferring the solder bump, due to the poor wetting of the oxide surface by the molten solder alloy. Thus the reliability of the bump 4 is degraded.

SUMMARY OF THE INVENTION

It is a general object of the present invention to provide a semiconductor device and a method for producing the same, in which the above disadvantages are eliminated.

Another and a more specific object of the present invention is to provide a semiconductor device and a method for producing the same, in which electrodes provided on a semiconductor substrate thereof and protruding electrodes can be connected with higher reliability.

Still another object of the present invention is to provide a semiconductor device comprising a semiconductor substrate; a plurality of electrode pads provided on said semiconductor substrate; a plurality of protruding electrodes, each corresponding to said electrode pad provided on said semiconductor substrate; and a plurality of barrier metal structures provided in correspondence to said electrode pads, each barrier metal structure including a plurality of deposited conductive metal layers for interconnecting said electrode pad to said protruding electrode; wherein an uppermost one of a plurality of said conductive metal layers of said barrier metal structure, which is in contact with said protruding electrode, covers an outer side wall of a conductive metal layer underlying said uppermost conductive layer.

Still another object of the present invention is to provide a method for producing a semiconductor device, comprising the step of a) forming a barrier metal structure which includes a plurality of deposited conductive metal layers on an electrode pad provided on a semiconductor substrate of said semiconductor device; and b) thereafter, forming a protruding electrode on said barrier metal structure; wherein said step a) further comprising the sub-steps of:—forming a first conductive metal coating on said semiconductor substrate, said first conductive metal coating being made of a material having a good adhesion with respect to said electrode;—forming a second conductive metal coating on said first conductive metal coating for connecting to said electrode electrically, said second conductive metal coating made of a material having a good adherence with said first conductive metal coating, said first and second metal coatings forming a first metal layer;—forming a second conductive metal layer which has an area at least including a forming area of said electrode pad by performing a patterning process only for said second conductive metal coating;—forming a third conductive metal coating made of a material having a good adherence with said second conductive metal layer and further with said protruding electrode, so as to cover at least said second conductive metal layer including a side wall part thereof; and pattering said first conductive metal layer while using said third conductive metal layer as a mask.

Other objects, features and advantages of the present invention will become more apparent from the following detailed description when read in conadherence with the accompanying drawings.

DETAILED DESCRIPTION OF THE PREFERRED EMBODIMENTS

Figure 3:
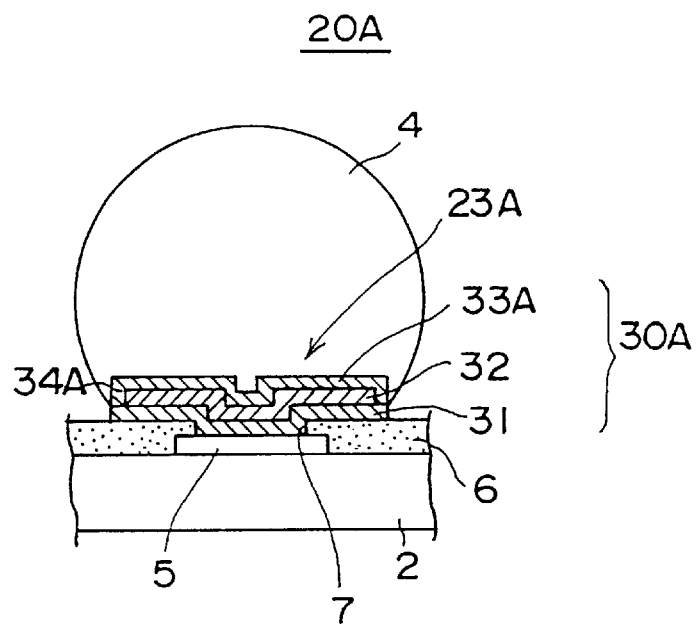
FIG. 3 is an enlarge diagram showing a barrier metal structure of an electrode pad provided on a semiconductor device of a first embodiment according to the present invention.

FIGS. 3 through 9 are diagrams for illustrating a semiconductor device 20A and a method for producing the same according to a first embodiment of the present invention. FIG. 3 is an enlarged diagram showing an electrode pad 23A and other parts therearound in the semiconductor device 20A. Also, FIGS. 4 through 9 show a procedure in order for producing a barrier metal structure 30 provided on the semiconductor device 20A.

Figure 1:
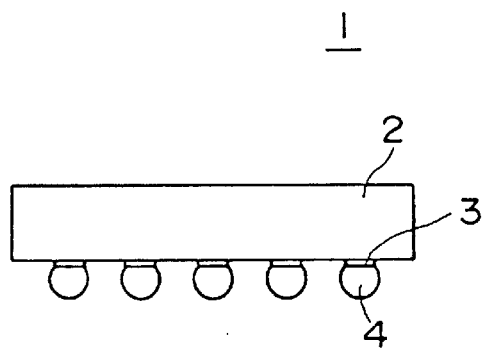
FIG. 1 is a diagram showing a conventional semiconductor device having bumps and electrode pads.
Figure 2:
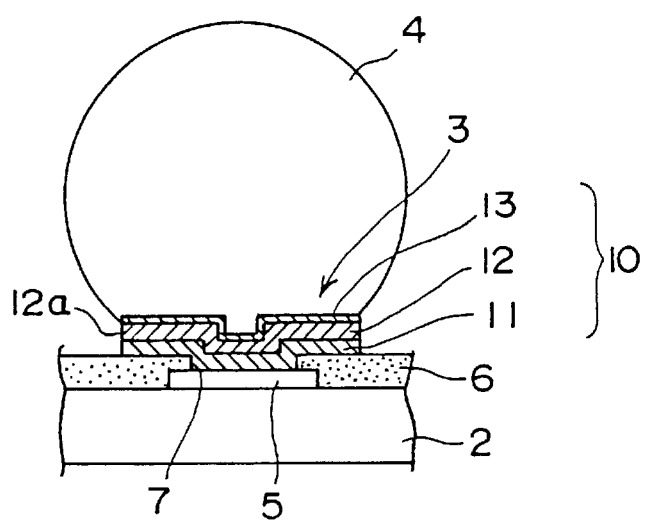
FIG. 2 is an enlarge diagram showing a barrier metal structure of one of the electrode pads shown FIG. 1.

The semiconductor device 20A of the present invention is featured in the barrier metal structure 30 and the other parts thereof are similar to those of the conventional semiconductor device. In FIGS. 3 through 9, parts, which are the same as those shown in FIGS. 1 and 2, are given the same reference numerals.

As shown in FIG. 3, the electrode pad 23A provided on the semiconductor device 20A includes an electrode 5 formed on a semiconductor chip 2 and a barrier metal structure 30A formed on the electrode 5. With respect to the semiconductor device 20A of this embodiment, the barrier metal structure 30A is a deposited structure consisting of a first, a second and a third conductive metal layers 31, 32 and 33.

The first conductive metal layer 31, which is in an undermost position joined to the electrode 5, is made of a material having a good property of joining thereto. Specifically, in this embodiment, the first conductive metal layer 31 is made of a material such as titanium (Ti) and has a thickness of approximately 500 nm.

Instead of titanium, the first conductive metal layer 31 may be made of a metal chosen from a group of chromium (Cr), molybdenum (Mo) and tungsten (W), or of an alloy containing a metal chosen form a group of titanium (Ti), chromium (Cr), molybdenum (Mo) and tungsten (W).

The second conductive metal layer 32, which is interposed between the first conductive metal layer 31 and the third conductive metal layer 33, should be made of a material having a good adhesion property with both of them. Specifically, in this embodiment, the second conductive metal layer 32 is made of a material such as nickel (Ni) and has a thickness of approximately 500 nm.

Instead of nickel, the second conductive metal layer 32 may be made of copper (Cu) or palladium (Pd), or of an alloy containing a metal chosen form a group of copper (Cu), nickel (Ni) and palladium (Pd).

The third conductive metal layer 33A, which is located uppermost, may also be referred to as an uppermost conductive metal layer. Also, the third conductive metal layer 33A should be made of a material having good adherence with bump 4 (solder bump in this embodiment) and diffusion resistance to the material (solders in this embodiment) for forming the bump 4, or of a material having resistance to the oxidation. Specifically, in this embodiment, the third conductive metal layer 33A is made of a material such as gold (Au) and has a thickness of approximately 100 nm (0.1 mm).

Instead of gold, the third conductive metal layer 33A may be made of a metal chosen from a group of platinum (Pt), palladium (Pd), and nickel (Ni), or of an alloy containing a metal chosen from a group of platinum (Pt), palladium (Pd), and nickel (Ni). Each of these metals can ensure the good adherence with the bump 4 and realize the resistance to the oxidation. Also, as a metal material, which can ensure the good adherence with the bump 4 and realize the resistance to the oxidation, nickel (Ni) or a metal mainly containing nickel (Ni) can be used.

In this embodiment, the first through third conductive metal layers 31, 32 and 33A are each described as a single metal layer. The present invention, however, is not limited to this, that is, each of them is not always configured to be the single metal layer but may itself be a plurality of conductive metal layers.

It should be noted that the third conductive metal layer 33A, in this embodiment, is provided with a covering portion 34A as a part thereof for covering a side wall surface of the second conductive metal layer 32. That is, in the barrier metal structure 30A according to this embodiment, the side wall surface of the second conductive metal layer 32 is not exposed but completely covered by the third conductive metal layer 33A.

For this reason, the present embodiment allows the bump 4 to extend to the region corresponding to the side of the second conductive metal layer 32. That is, the covering portion 34A is formed integrally with the third conductive metal layer 33A which is made of a metal having a good wetting with the solders of the bump 4.

Accordingly, it is possible to provide the bump 4 the covering portion 34A covering the side wall surface of the second conductive metal layer 32. Thereby, a contact area of the bump 4 with the third conductive metal layer 33A can be increased, and as a result the adherence and strength between bump 4 and the barrier metal structure 30A can be enhanced.

Since the side wall surface of the second conductive metal layer 32 is completely covered by the covering portion 34A which is made of a material such as nickel (Ni) which resists diffusion, the bump 4 can be prevented from diffusing into the second conductive metal layer 32, even in the case in which the second conductive metal layer 32 is made of a metal material which cannot resist the diffusion of the solder bump 4.

That is, by using the material, which resists the diffusion of the bump 4, to form the third conductive metal layer 33A, the diffusion of the solders of the bump 4 into the second conductive metal layer 32 and therethrough further into the electrode pad 3 can be prevented. Hence, reliability of the semiconductor device 20A can be improved.

Next, a description is now given of a method for producing the above-mentioned barrier metal structure 30A.

Figure 4:
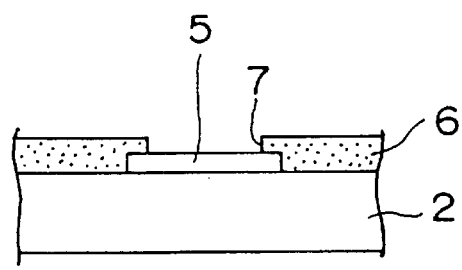
FIG. 4 is a diagram illustrating a method for producing the semiconductor device of the first embodiment and showing a state before the barrier metal structure is formed according to the present invention.
Figure 5:
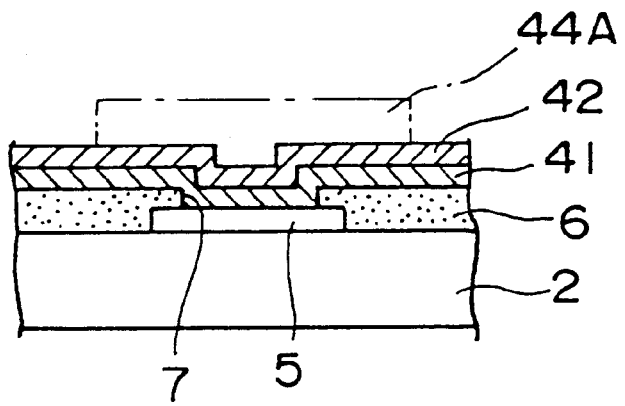
FIG. 5 is a diagram illustrating the method for producing the semiconductor device of the first embodiment and showing a state in which a first and second conductive metal layers are formed according to the present invention.

FIG. 4 is a diagram showing the semiconductor chip 2 on which an opening portion is provided for exposing the electrode pad 3 to the insulating layer 6. With respect to the producing method, at first, a first conductive metal coating 41 is formed on the semiconductor chip 2 by way of a sputtering process. And then, as shown in FIG. 5, a second conductive metal coating 42 is formed on the first conductive metal coating 41.

In this embodiment, the first conductive metal coating 41 may be made of titanium (Ti) and has a thickness of approximately 500 nm. The second conductive metal coating 42 may be made of nickel (Ni) and has a thickness of approximately 500 nm.

Figure 6:
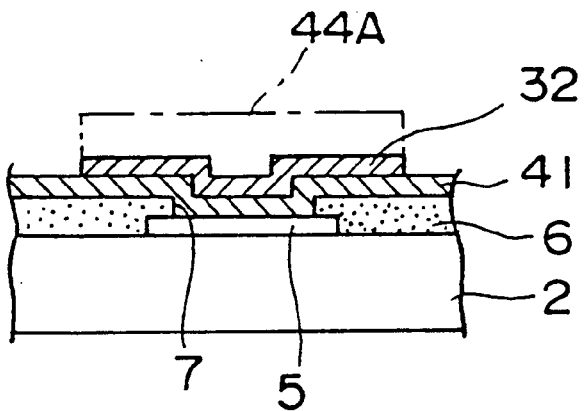
FIG. 6 is a diagram illustrating the method for producing the semiconductor device of the first embodiment and showing a state in which a second conductive metal layer is formed according to the present invention.

As shown in FIG. 6, when the first and second conductive metal coatings 41 and 42 have been thus formed, a positive resist 44A is provided for covering the electrode pad 3. Then, by a wet-etching process, the second conductive metal coating 42 is patterned in a size of, for example, 100 $\mu$m in diameter so that the second conductive metal layer 32 can be formed. Thereafter, the resist 44A is removed.

Figure 7:
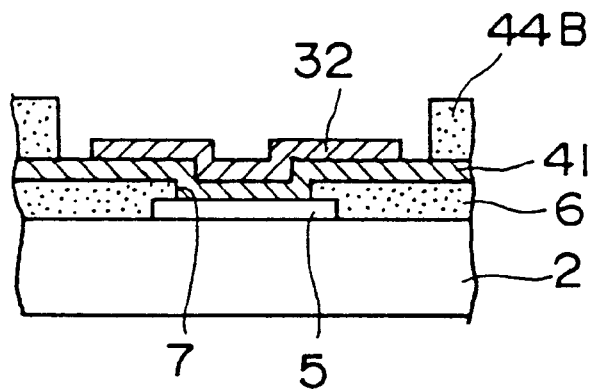
FIG. 7 is a diagram illustrating the method for producing the semiconductor device of the first embodiment and showing a state in which a resist is provided according to the present invention.

Then, as shown in FIG. 7, a positive resist 44B, which has a larger resist opening in a size of 110 $\mu$m in diameter, is formed on the first conductive metal coating 41 and in an upper position of the electrode 3.

Figure 8:
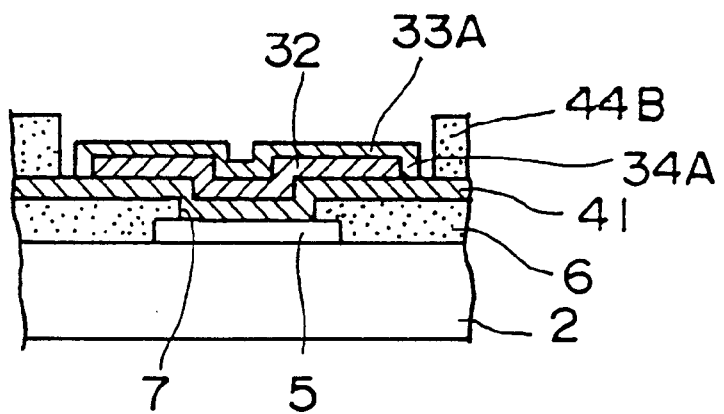
FIG. 8 is a diagram illustrating the method for producing the semiconductor device of the first embodiment and showing a state in which a third conductive metal layer is formed according to the present invention.

As shown in FIG. 8, an electric current is applied to the first conductive metal coating 41. And then by way of an electrolytic plating process, the third conductor metal layer 33A is formed with a thickness of 0.1 $\mu$m on the first conductor metal coating 41 and the second conductive metal layer 32. In this embodiment, the third conductive metal layer 33A is made of gold (Au). As previously described, since the resist 44B includes the opening which is larger in size than the second conductive metal layer 32, the third conductive metal layer 33A is formed by way of the electrolytic plating process so as to cover the side wall surface of the second conductive metal layer 32.

Thereafter, the resist 44B is removed, and at the same time unwanted parts of the first conductive metal coating 41 are removed by way of the wet-etching process while using the third conductive layer 33A as a mask. Thereby, as shown in FIG. 9, the barrier metal structure 30A is thus produced.

Figure 9:
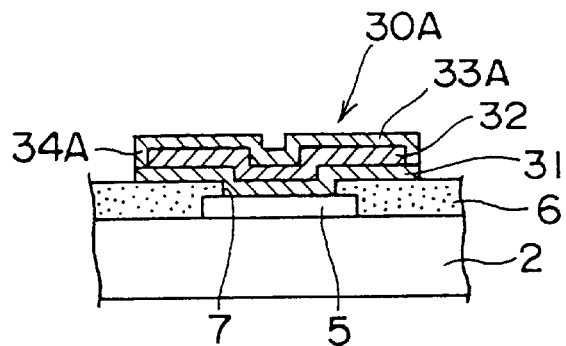
FIG. 9 is a diagram illustrating the method for producing the semiconductor device of the first embodiment and showing a state in which the barrier metal structure is formed according to the present invention.

It is clear from FIG. 9 that, in the barrier metal structure 30A thus produced, the side wall surface of the second conductive metal layer 32 is covered by the covering portion 34A of the third conductive metal layer 33A. Accordingly, even in a case where the solder bump 4 containing (Pb/sn (95/5)) is formed on the above-mentioned barrier metal structure 30A by way of, for example, the solder transferring process, the bump 4 can be formed even thereon because the covering portion 34A of the third conductive metal layer 33A is provided on the side wall surface of the second conductive metal layer 32. As a result, the contact area of the bump 4 with the barrier metal structure 30A is increased and thereby the adherence strength thereof can be improved.

Additionally, the first conductive metal layer 31 is made of titanium (Ti) in this embodiment but may be made of chromium (Cr), titanium (Ti) or tungsten (W), or of a metal mainly containing them. Moreover, the above-mentioned metal coatings may each consist of a plurality of layers.

Figure 10:
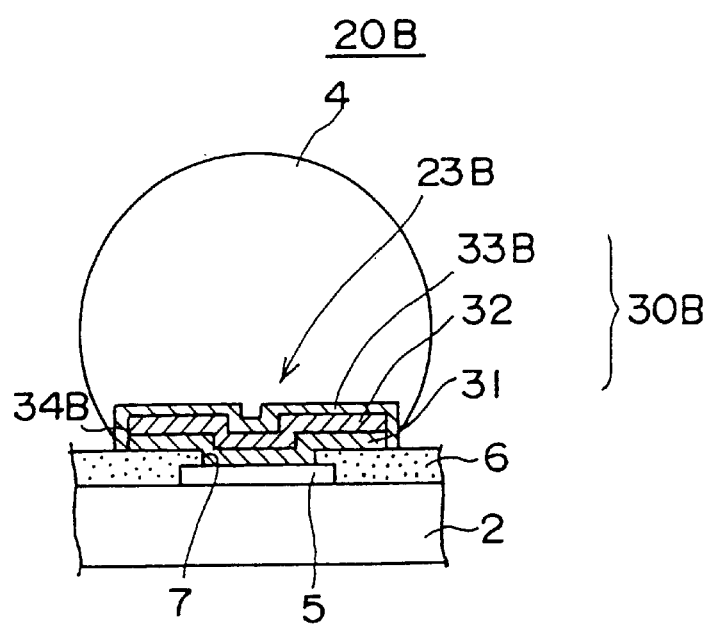
FIG. 10 is an enlarged diagram showing a barrier metal structure of an electrode pad provided on a semiconductor device of a second embodiment according to the present invention.

FIG. 10 is an enlarged view showing an electrode pad structure 23B and it neighboring parts of an semiconductor device 20B according to a second embodiment of the present invention. In FIG. 10, parts, which are the same as those shown in FIGS. 3 through 9, are given the same reference numerals, and a description thereof is omitted.

In this embodiment, a barrier metal structure 30B consists of the first conductive metal layer 31, the second conductive metal layer 32 and a third conductive metal layer 33B.

The first conductive metal layer 31 is made of titanium (Ti) and has a thickness of 500 nm. The second conductive metal layer 32 is made of copper (Cu) and has a thickness of 500 nm. A third conductive metal layer 33B is made of nickel (Ni) by way of an electrolytic plating process, which is the same as that used in the first embodiment, and has a thickness of 2 $\mu$m.

It should be note that, as shown in FIG. 10, both of the side wall surfaces of the first and second conductive metal layers 31 and 32 are covered by a covering portion 34B, which is integrally formed with the third conductive metal layer 33B. In above-mentioned first embodiment, the structure where only the side wall surface of the second conductive metal layer 32 is covered by the covering portion 34A of the third conductive metal layer 33A is described, but it may also be configured as that in the second embodiment, where the side wall surfaces of first and second conductive metal layers 31 and 32 are covered by the covering portion 34A of the third conductive metal layer 33A.

In a case where a solder bump 4 is formed on the above-mentioned barrier metal structure 30B by way of, for example, the transferring process, if the conventional structure as shown in FIG. 2 is used where tin (Sn) contained in the bump 4 is subject to diffusing into the second conductive metal layer 12 made of copper (Cu), there is a possibility that a Cu—Sn diffusion advances from the side wall surface of the second conductive metal layer 32.

However, according to the barrier metal structure 30B of the present invention, since the side wall surface of the second conductive metal layer 32 is covered by the third conductive metal layer 33B made of nickel (Ni) capable of resisting the Cu—Sn diffusion, the Cu—Sn diffusion advancing therefrom can be prevented. Hence, reliability of the semiconductor device 20B can be enhanced.

Further, in this embodiment, besides the second conductive metal layer 32, the first conductive metal layer 31 is also covered by the third conductive metal layer 33B, and thereby a contact area of the bump 4 with the barrier metal structure 30B can be further increased. Hence, higher reliability of the semiconductor device 20B can be achieved.

The above description is provided in order to enable any person skilled in the art to make and use the invention and sets forth the best mode contemplated by the inventions of carrying out their invention.

The present invention is not limited to the specifically disclosed embodiment, and variations and modifications may be made without departing from the scope of the present invention.

The present application is based on Japanese priority application No. 11-105586 filed on Apr. 13, 1999, the entire contents of which are hereby incorporated by reference.

What is claimed is:

1. A semiconductor device comprising:
    a semiconductor substrate;
    a plurality of electrode pads provided on said semiconductor substrate; a plurality of protruding electrodes corresponding to said plurality of electrode pads and;
    a plurality of barrier metal structures, each including a plurality of conductive metal layers interconnecting one of the plurality of electrode pads and a corresponding one of the plurality of protruding electrodes thereto; wherein
        an uppermost one of the plurality of conductive metal layers of the barrier metal structure, which is in contact with said protruding electrode, includes a covering portion that covers a side wall surface of a middle one of the plurality of conductive metal layers thereunder; wherein
        the uppermost one of the plurality of conductive metal layers resists diffusion/oxidation of the plurality of protruding electrodes and the middle one of the plurality of conductive metal layers is not in contact with an insulating layer thereunder and does not resist diffusion/oxidation of the plurality of protruding electrodes but is separated from the plurality of protruding electrodes by the covering portion,
        wherein said protruding electrode includes a conductive metal containing at least one of tin (Sn) and lead (Pb) or of an alloy of tin (Sn) and lead (Pb),
        wherein the covering portion of the uppermost one of the plurality of conductive metal layers is provided such that the covering portion covers side walls of only the middle one of the plurality of conductive metal layers.

2. The semiconductor device as claimed in claim 1, wherein said barrier metal structure includes:
    a first conductive metal layer which is formed on said electrode pad of said semiconductor substrate and has a single or plural conductive metal coatings made of a material having a comparatively good adhesion property with said electrode pad;
    a third conductive metal layer, as said uppermost conductive metal layer, which and has a single or plural conductive metal coatings made of a material having a comparatively good adhesion property with said protruding electrode; and
    a second conductive metal layer, sandwiched between said first and third conductive metal layers, which has a single or plural conductive metal coatings made of a material having a comparatively good adhesion property with both of said first and third conductive metal layers;
    said material, of which said third conductive metal layer is made, being resistant to oxidation and further resistant to diffusion of a material of said protruding electrode.

3. The semiconductor device as claimed in claim 2, wherein said first conductive metal layer includes a conductive metal coating made of any one of titanium (Ti), chromium (Cr), and tungsten (W) or of an alloy containing any one of titanium (Ti), chromium (Cr), and tungsten (W).

4. The semiconductor device as claimed in claim 2, wherein said second conductive metal layer includes a conductive metal coating made of any one of copper (Cu), nickel (Ni), and palladium (Pd) or of an alloy containing any one of copper (Cu), nickel (Ni), and palladium (Pd).

* * * * *